US009490298B2

(12) United States Patent
Kim et al.

(10) Patent No.: US 9,490,298 B2
(45) Date of Patent: Nov. 8, 2016

(54) MAGNETIC MEMORY DEVICES HAVING A PERPENDICULAR MAGNETIC TUNNEL JUNCTION

(71) Applicants: Woojin Kim, Yongin-si (KR); Ki Woong Kim, Yongin-si (KR); Woo Chang Lim, Seoul (KR)

(72) Inventors: Woojin Kim, Yongin-si (KR); Ki Woong Kim, Yongin-si (KR); Woo Chang Lim, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 190 days.

(21) Appl. No.: 14/264,049

(22) Filed: Apr. 28, 2014

(65) Prior Publication Data

US 2015/0035095 A1    Feb. 5, 2015

(30) Foreign Application Priority Data

Aug. 2, 2013    (KR) .......................... 10-2013-0091983

(51) Int. Cl.
*H01L 29/82*    (2006.01)
*H01L 21/8239*    (2006.01)
(Continued)

(52) U.S. Cl.
CPC ............ *H01L 27/224* (2013.01); *G11C 11/161* (2013.01); *H01F 10/3254* (2013.01); *H01L 43/08* (2013.01); *H01F 10/3204* (2013.01); *H01F 10/3286* (2013.01)

(58) Field of Classification Search
CPC ... H01L 43/08; H01L 27/224; H01L 27/222; G11C 11/161
USPC .......................... 257/421, E21.665, E29.323
See application file for complete search history.

(56) References Cited

U.S. PATENT DOCUMENTS 8,098,514 B2    1/2012    Nagase et al.
8,183,652 B2    5/2012    Ranjan et al.
(Continued)

FOREIGN PATENT DOCUMENTS

JP    2010080496 A    4/2010
JP    2012174709 A    9/2012

OTHER PUBLICATIONS

E. B. Myers et al., "Current-Induced Switching of Domains in Magnetic Multilayer Devices", Science vol. 285 (Aug. 6, 1999), pp. 867-870 (downloaded from www.sciencemag.org on Apr. 16, 2011).

(Continued)

*Primary Examiner* — Marcos D Pizarro
(74) *Attorney, Agent, or Firm* — Renaissance IP Law Group LLP

(57) ABSTRACT

A magnetic memory device may include a free magnetic structure and a reference magnetic structure that are separated from each other by a tunnel barrier. The free magnetic structure may include an exchange-coupling layer, and first and second free layers that are separated from each other by the exchange-coupling layer. The first free layer may be provided between the second free layer and the tunnel barrier. A thickness of the first free layer may be greater than a first maximum anisotropy thickness, being the thickness at which the first free layer has maximum perpendicular anisotropy. A thickness of the second free layer may be smaller than a second maximum anisotropy thickness, being the thickness at which the second free layer has maximum perpendicular anisotropy. A magnetic tunnel junction having two free layers with different thicknesses can enable a magnetic memory device that has increased MR ratio and reduced switching current.

16 Claims, 12 Drawing Sheets

(51) Int. Cl.
    *H01L 27/105*     (2006.01)
    *H01L 27/22*     (2006.01)
    *H01L 43/08*     (2006.01)
    *G11C 11/16*     (2006.01)
    *H01F 10/32*     (2006.01)

(56) References Cited

U.S. PATENT DOCUMENTS

| | | |
|---|---|---|
| 8,268,641 B2 | 9/2012 | Guo et al. |
| 8,823,118 B2 * | 9/2014 | Horng et al. ........... H01L 43/12 257/421 |
| 9,147,833 B2 * | 9/2015 | Pi et al. ................. H01L 43/04 |
| 2008/0191251 A1 | 8/2008 | Ranjan et al. |
| 2009/0080239 A1 | 3/2009 | Nagase et al. |
| 2010/0055502 A1 | 3/2010 | Kubota et al. |
| 2012/0064640 A1 | 3/2012 | Guo et al. |
| 2012/0068284 A1 | 3/2012 | Kitagawa et al. |
| 2012/0069640 A1 | 3/2012 | Nagase et al. |
| 2012/0155156 A1 * | 6/2012 | Watts et al. ............ B82Y 25/00 365/158 |
| 2014/0145792 A1 * | 5/2014 | Wang et al. ........ H01F 10/3272 331/94.1 |

OTHER PUBLICATIONS

J.C. Slonczewski, "Current-driven excitation of magnetic multilayers", Journal of Magnetism and Magnetic Materials 159 (1996), pp. L1-L7.

L. Berger, Emission of spin waves by a magnetic multilayer traversed by a current, Physical Review B, vol. 54, No. 13 (Oct. 1, 1996), pp. 9353-9358.

* cited by examiner

MAGNETIC MEMORY DEVICES HAVING A PERPENDICULAR MAGNETIC TUNNEL JUNCTION

CROSS-REFERENCE TO RELATED APPLICATIONS

This U.S. non-provisional patent application claims priority under 35 U.S.C. §119 to Korean Patent Application No. 10-2013-0091983, filed on Aug. 2, 2013, in the Korean Intellectual Property Office, the contents of which are hereby incorporated herein by reference in their entirety.

BACKGROUND OF THE INVENTION

Example embodiments of the inventive concepts relate to a magnetic memory device, and in particular, to a magnetic memory device with a perpendicular magnetic tunnel junction.

Due to the increased demand for electronic devices having a fast operating speed and low power consumption, semiconductor devices used in those electronic devices must also provide a fast operating speed with a low operating voltage. A magnetic memory device has been suggested as a way to satisfy such requirements. For example, the magnetic memory device can provide technical advantages, such as low latency and non-volatility. As a result, the magnetic memory device is being regarded as an emerging, next-generation memory device.

The magnetic memory device may include a magnetic tunnel junction (MTJ). The magnetic tunnel junction may include two magnetic layers and a tunnel barrier layer interposed therebetween. Resistance of the magnetic tunnel junction may vary depending on magnetization orientations of the magnetic layers. For example, the resistance of the magnetic tunnel junction may be higher when the magnetic layers have anti-parallel magnetization orientations than when they have parallel magnetization orientations. Such a difference in resistance can be utilized for a data storing operation of a magnetic memory device. However, more research is still needed to be able to successfully and efficiently mass-produce the magnetic memory device.

SUMMARY

Example embodiments of the inventive concepts provide a magnetic memory device, in which a magnetic tunnel junction is configured to have an increased MR ratio and a reduced switching current, and a method of fabricating the same.

According to example embodiments of the inventive concepts, a magnetic memory device may include a free magnetic structure and a reference magnetic structure spaced apart from each other with a tunnel barrier disposed therebetween. The free magnetic structure may include an exchange-coupling layer and first and second free layers spaced apart from each other on opposing sides of the exchange-coupling layer, and the first free layer may be provided between the second free layer and the tunnel barrier. A thickness of the first free layer may be greater than a first maximum anisotropy thickness (a thickness at which the first free layer has maximum perpendicular anisotropy), and a thickness of the second free layer may be less than a second maximum anisotropy thickness (a thickness at which the second free layer has maximum perpendicular anisotropy).

In example embodiments, the first and second free layers may be configured to have an interface perpendicular anisotropy.

In example embodiments, the thickness of the first free layer may be less than a maximum thickness, thereby allowing the first free layer to have perpendicular magnetization.

In example embodiments, the thickness of the second free layer may be greater than a minimum thickness, thereby allowing the second free layer to have perpendicular magnetization.

In example embodiments, the second free layer may include at least one portion having an amorphous structure.

In example embodiments, the first free layer may include the same material as the second free layer, and the thickness of the first free layer may be at least about 1.5 times the thickness of the second free layer.

In example embodiments, each of the first and second free layers may include a material exhibiting an intrinsic in-plane magnetization property.

In example embodiments, the first and second free layers may include at least one of cobalt, iron, or nickel, and boron.

In example embodiments, the free magnetic structure may further include a perpendicular magnetization enhancement layer spaced apart from the exchange-coupling layer and arranged on an opposite side of the second free layer as the exchange-coupling layer.

In example embodiments, the perpendicular magnetization enhancement layer may be in contact with the second free layer.

In example embodiments, the perpendicular magnetization enhancement layer may include at least one portion having an amorphous structure.

In example embodiments, the perpendicular magnetization enhancement layer may be thinner than the tunnel barrier.

In example embodiments, an RA value of the perpendicular magnetization enhancement layer may be less than that of the tunnel barrier.

In example embodiments, the perpendicular magnetization enhancement layer may include metal oxide.

In example embodiments, the magnetic memory device may further include a substrate. The free magnetic structure may be provided between the substrate and the tunnel barrier.

In example embodiments, the magnetic memory device may further include a substrate. The free magnetic structure may be provided spaced apart from the substrate on an opposite side of the tunnel barrier.

In example embodiments, the exchange-coupling layer may include metal.

In example embodiments, the exchange-coupling layer may include at least one of Ta, W, Nb, Ru, Ti, Cr, V, Mo, or Re.

According to example embodiments of the inventive concepts, a magnetic memory device may include a tunnel barrier on a substrate, and a free magnetic structure and a reference magnetic structure spaced apart from each other on opposite sides of the tunnel barrier. The free magnetic structure may include a first free layer and a second free layer, which are spaced apart from each other on opposing sides of an exchange-coupling layer to have an interface perpendicular magnetic anisotropy, and a perpendicular magnetization enhancement layer arranged in contact with the second free layer and on an opposite side of the second free layer as the exchange-coupling layer. The second free layer may be thinner than the first free layer.

In example embodiments, the perpendicular magnetization enhancement layer may include at least one portion having an amorphous structure.

In example embodiments, the perpendicular magnetization enhancement layer may be thinner than the tunnel barrier.

In example embodiments, an RA value of the perpendicular magnetization enhancement layer may be less than that of the tunnel barrier.

In example embodiments, the perpendicular magnetization enhancement layer may include metal oxide.

In example embodiments, a thickness of the first free layer may be greater than a first maximum anisotropy thickness (a thickness at which the first free layer has maximum perpendicular anisotropy) and may be less than a maximum thickness, allowing the first free layer to have perpendicular magnetization.

In example embodiments, a thickness of the second free layer may be greater than a minimum thickness, allowing the second free layer to have perpendicular magnetization, and may be less than a second maximum anisotropy thickness (a thickness at which the second free layer has maximum perpendicular anisotropy).

According to example embodiments of the inventive concepts, a magnetic memory device may include a tunnel barrier on a substrate, and a free magnetic structure and a reference magnetic structure spaced arranged on opposing sides of the tunnel barrier. The free magnetic structure may include a first free layer and a second free layer, which are spaced apart from each other on opposite sides of an exchange-coupling layer, and a perpendicular magnetization enhancement layer, which is in contact with the second free layer and is arranged on an opposite side of the second free layer as the exchange-coupling layer. Each of the perpendicular magnetization enhancement layer and the second free layer may include at least one portion having an amorphous structure.

In example embodiments, the first free layer may have a BCC structure, and the tunnel barrier may have a NaCl structure.

In example embodiments, the perpendicular magnetization enhancement layer may be thinner than the tunnel barrier, and the perpendicular magnetization enhancement layer may include metal oxide.

In example embodiments, a thickness of the first free layer may be greater than the first maximum anisotropy thickness and may be less than a maximum thickness, thereby allowing the first free layer to have perpendicular magnetization.

In example embodiments, a thickness of the second free layer may be greater than a minimum thickness, allowing the second free layer to have perpendicular magnetization, and may be less than the second maximum anisotropy thickness.

In example embodiments, the exchange-coupling layer may include at least one of Ta, W, Nb, Ru, Ti, Cr, V, Mo, or Re.

BRIEF DESCRIPTION OF THE DRAWINGS

Example embodiments will be more clearly understood from the following brief description taken in conjunction with the accompanying drawings. In the drawings.

DETAILED DESCRIPTION

Figure 1:
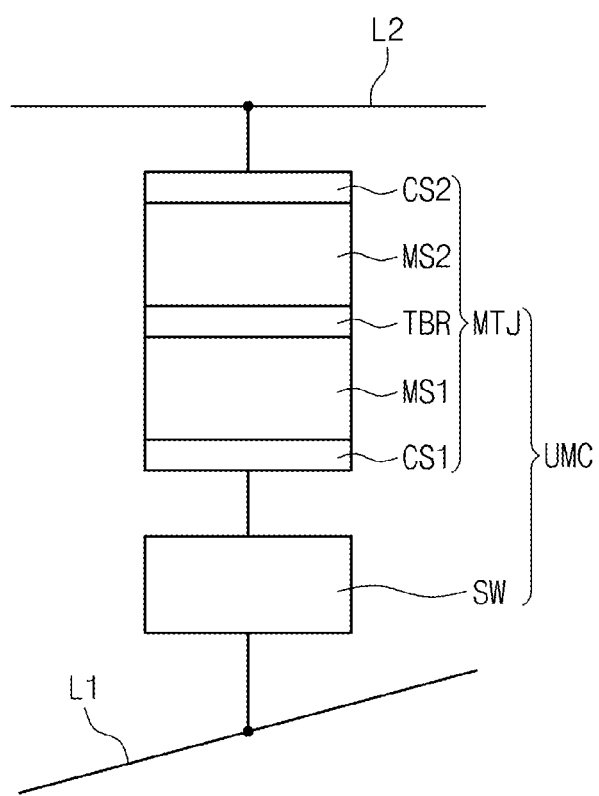
FIG. 1 is a schematic circuit diagram illustrating a unit memory cell of a magnetic memory device according to example embodiments of the inventive concepts.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, each of the figures is intended to illustrate the general characteristics of methods, structure and/or materials utilized in certain example embodiments and to supplement the written description provided below. The drawings are not, however, to scale and may not precisely reflect the structural or performance characteristics of any given embodiment, and should not be interpreted as defining or limiting the range of values or properties encompassed by these example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature. Like reference numerals in the drawings denote like elements, and redundant descriptions thereof will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. Rather, these terms are only used to distinguish one element, component, region, layer or section from another element, component, region, layer or section. Thus, a first element, component, region, layer or section discussed below could be termed a second element, component, region, layer or section without departing from the teachings of example embodiments. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein should be interpreted accordingly.

The terminology used herein is for the purpose of describing particular embodiments only and is not intended to be limiting of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly-used dictionaries, should be interpreted as having a meaning that is consistent with their meaning in the context of the relevant art and should not be interpreted in an idealized or overly formal sense unless expressly so defined herein.

FIG. 1 is a schematic circuit diagram illustrating a unit memory cell of a magnetic memory device according to example embodiments of the inventive concepts.

Referring to FIG. 1, a unit memory cell UMC may be disposed between intersecting first and second interconnection lines L1 and L2, respectively. The unit memory cell UMC may be connected in series to the first and second interconnection lines L1 and L2, respectively. The unit memory cell UMC may include a selection device SW and a magnetic tunnel junction MTJ. The selection device SW and the magnetic tunnel junction MTJ may be electrically connected to each other in series. In certain embodiments, one of the first and second interconnection lines L1 and L2, respectively, may be used as a word line, and the other may be used as a bit line.

The selection device SW may be configured to selectively control an electric current passing through the magnetic tunnel junction MTJ. For example, the selection device SW may be one of a diode, a PNP bipolar transistor, an NPN bipolar transistor, an NMOS field effect transistor (FET), and a PMOS FET. When the selection device SW is a three-terminal switching device, such as bipolar transistors and MOSFETs, an additional interconnection line (not shown) may be connected to the selection device SW.

The magnetic tunnel junction MTJ may include a first perpendicular magnetic structure MS1, a second perpendicular magnetic structure MS2, and a tunnel barrier TBR interposed therebetween. Each of the first and second perpendicular magnetic structures MS1 and MS2, respectively, may include at least one magnetic layer. In example embodiments, as shown for instance in FIG. 1, the magnetic tunnel junction MTJ may further include a first conductive structure CS1 interposed between the first perpendicular magnetic structure MS1 and the selection device SW, and a second conductive structure CS2 interposed between the second perpendicular magnetic structure MS2 and the second interconnection line L2.

Figure 2:
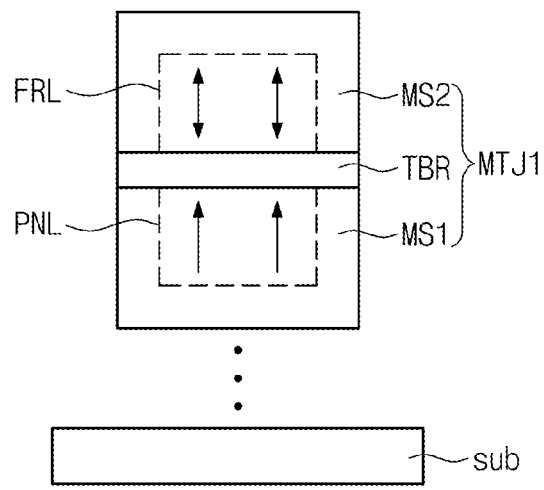
FIGS. 2 and 3 are schematic diagrams illustrating magnetic tunnel junctions according to example embodiments of the inventive concepts.
Figure 3:
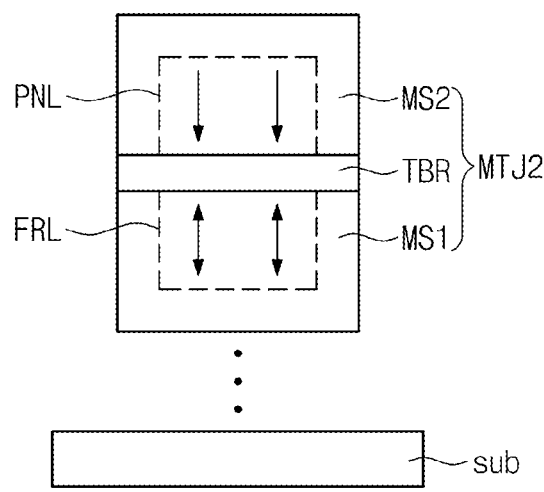

FIGS. 2 and 3 are schematic diagrams illustrating magnetic tunnel junctions according to example embodiments of the inventive concepts. Referring to FIGS. 2 and 3, one of the magnetic layers of the first and second perpendicular magnetic structures MS1 and MS2, respectively, may be configured to have a fixed magnetization direction, which is not changed by an external magnetic field generated under usual environments. In the present specification, for convenience in description, the term "reference magnetic structure PNL" will be used to refer to a magnetic layer having such a fixed magnetization property. By contrast, the other of the magnetic layers of the first and second perpendicular magnetic structures MS1 and MS2, respectively, may be configured to have a variable magnetization direction, which can be switched by an external magnetic field applied thereto. Hereinafter, the term "free magnetic structure FRL" will be used to refer to a magnetic layer having such a switchable magnetization property. For example, as shown in FIGS. 2 and 3, the magnetic tunnel junction MTJ1 and MTJ2 may include at least one free magnetic structure FRL and at least one reference magnetic structure PNL separated from each other by the tunnel barrier TBR.

Electrical resistance of the magnetic tunnel junction MTJ1 and MTJ2 may depend on a relative orientation of magnetization directions of the free and reference magnetic structures FRL and PNL, respectively. For example, the electrical resistance of the magnetic tunnel junction MTJ1 and MTJ2 may be far greater when the relative orientation is antiparallel than when it is parallel. This means that the electrical resistance of the magnetic tunnel junction MTJ1 and MTJ2 can be controlled by changing the magnetization direction of the free magnetic structure FRL. Magnetic memory devices according to embodiments of the inventive concepts may be realized by utilizing this data storing mechanism.

As shown in FIGS. 2 and 3, the first and second perpendicular magnetic structures MS1 and MS2, respectively, of the magnetic tunnel junction MTJ1 and MTJ2 may be sequentially formed on a substrate Sub. Depending on a relative configuration between the free magnetic structure FRL and the substrate Sub, and/or a forming order of the free and reference magnetic structures FRL and PNL, respectively, the magnetic tunnel junction MTJ1 and MTJ2 may, for example, be classified into one of two types:

(a) a first type of magnetic tunnel junction MTJ1 configured so that the first and second perpendicular magnetic structures MS1 and MS2, respectively, include the reference and free magnetic structures PNL and FRL, respectively, as shown in FIG. 2, and (b) a second type of magnetic tunnel junction MTJ2 configured so that the first and second perpendicular magnetic structures MS1 and MS2, respectively, include the free and reference magnetic structures FRL and PNL, respectively, as shown in FIG. 3.

Figure 4:
FIG. 4 is a somewhat schematic sectional view illustrating a free magnetic structure of a magnetic tunnel junction according to example embodiments of the inventive concepts.

FIG. 4 is a somewhat schematic sectional view illustrating a free magnetic structure of a magnetic tunnel junction according to example embodiments of the inventive concepts.

Referring to FIG. 4, the free magnetic structure FRL may include a first free layer FL1, a first exchange-coupling layer 105, and a second free layer FL2, which are sequentially provided between the tunnel bather TBR and the second conductive structure CS2. According to the present embodiment, the free magnetic structure FRL may be a part of the first type of magnetic tunnel junction MTJ1 of FIG. 2.

The tunnel bather TBR may include at least one of the following materials: oxides of magnesium (Mg), oxides of titanium (Ti), oxides of aluminum (Al), oxides of magnesium-zinc (MgZn), oxides of magnesium-boron (MgB), nitrides of titanium (Ti), or nitrides of vanadium (V). For example, the tunnel bather TBR may be a layer of magnesium oxide (MgO). Alternatively, the tunnel barrier TBR may include a plurality of layers consisting of one or more different materials.

A thickness of the first exchange-coupling layer 105 may be selected so that the first free layer FL1 can exhibit an antiparallel perpendicular magnetization through a magnetic interaction with the second free layer FL2. An exchange integral energy between the first free layer FL1 and the second free layer FL2 may be zero or greater. In example embodiments, the first exchange-coupling layer 105 may have a thickness ranging from between about 2 Å to about 10 Å.

The first exchange-coupling layer 105 may be formed of, or include, at least one of Ta, W, Nb, Ru, Ti, Cr, V, Mo, or Re. The first exchange-coupling layer 105 may, for example, be formed to have a body centered cubic (BCC) or hexagonal close packed (HCP) structure.

A perpendicular magnetization enhancement layer 150 may be provided between the second free layer FL2 and the second conductive structure CS2. The perpendicular magnetization enhancement layer 150 may include a layer of metal oxide. For example, the perpendicular magnetization enhancement layer 150 may include at least one material selected from the group consisting of oxides of magnesium (Mg), oxides of titanium (Ti), oxides of aluminum (Al), oxides of magnesium-zinc (MgZn), and oxides of magnesium-boron (MgB). For example, the perpendicular magnetization enhancement layer 150 may be formed of magnesium oxide (MgO). At least a portion of the perpendicular magnetization enhancement layer 150 may have an amorphous structure. For example, the perpendicular magnetization enhancement layer 150 may be substantially amorphous, or a lower portion thereof in contact with the second free layer FL2 may be amorphous. Herein, "substantially amorphous" means that a layer or pattern under consideration is virtually amorphous, although a portion therein may have a localized grain boundary or a different crystalline orientation. For example, a substantially amorphous layer may include a plurality of portions having a low angle grain boundary.

According to example embodiments of the inventive concepts, the second free layer FL2 may have a magnetization direction that is parallel to a thickness direction thereof, for example, as a result of an antiferromagnetic exchange coupling with the first free layer FL1 through the first exchange-coupling layer 105. In other words, the second free layer FL2 may have a magnetization direction that is perpendicular to a top surface of the tunnel barrier TBR.

The first free layer FL1 and the second free layer FL2 may include a material having an interface perpendicular magnetic anisotropy. The interface perpendicular magnetic anisotropy may refer to a perpendicular magnetization phenomenon, which may be seen at an interface of a magnetic layer with an intrinsically in-plane magnetization property, when the magnetic layer is in contact with another layer. Here, the term "intrinsic in-plane magnetization property" means that a magnetization direction of a magnetic layer is oriented parallel to a longitudinal direction thereof when there is no external magnetic field applied thereto. For example, where a magnetic layer with the intrinsic in-plane magnetization property is formed on a substrate and there is no external magnetic field applied thereto, a magnetization direction of the magnetic layer may be oriented substantially parallel to the top surface of the substrate.

Although the first and second free layers FL1 and FL2 have the intrinsic in-plane magnetization property, a layer adjacent thereto may allow the first and second free layers FL1 and FL2, respectively, to exhibit an extrinsic perpendicular magnetization property. The extrinsic perpendicular magnetization property may be dependent on thicknesses of the free layers. The dependency of an interface perpendicular magnetic anisotropy of the interface magnetic layer and an MR ratio of the device on a thickness of the interface magnetic layer will now be described in more detail with reference to FIGS. 12 and 13.

Figure 12:
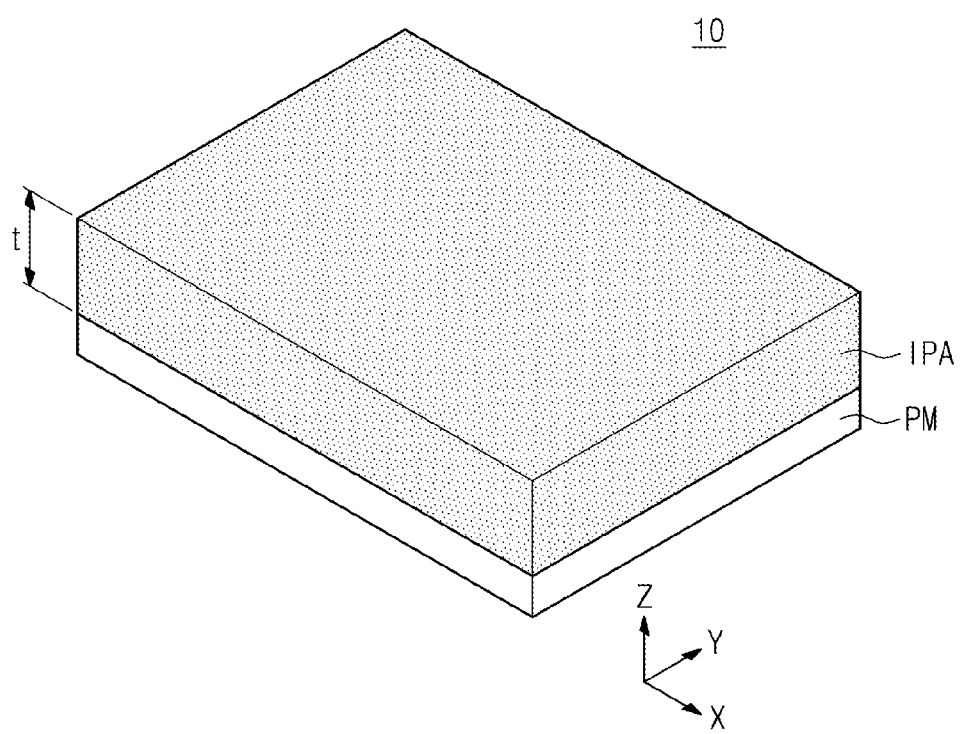
FIG. 12 is a somewhat schematic illustration of an interface between a magnetic layer and a perpendicular magnetization inducing layer to help describe interface perpendicular magnetic anisotropy of the magnetic layer resulting from contact with the perpendicular magnetization inducing layer.
Figure 13:
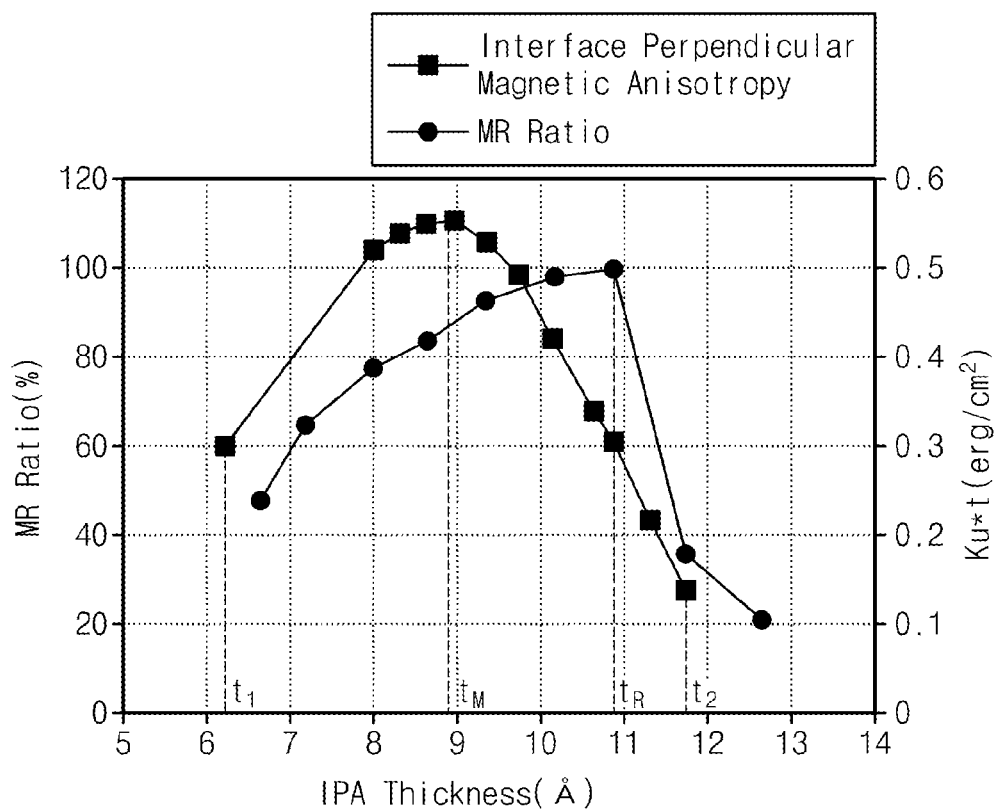
FIG. 13 is a graph illustrating the dependency of a perpendicular anisotropy of the interface magnetic layer and an MR ratio of the magnetic memory device on a thickness of the interface magnetic layer.

FIG. 12 is a somewhat schematic illustration of an interface between a magnetic layer IPA and a perpendicular magnetization inducing layer PM to help describe interface perpendicular magnetic anisotropy of the magnetic layer IPA resulting from contact with the perpendicular magnetization inducing layer PM. The magnetic layer contacting the perpendicular magnetizing inducing layer PM will be referred to hereinafter as an "interface magnetic layer IPA". FIG. 13 is a graph showing the dependency of a perpendicular anisotropy of the interface magnetic layer IPA and an MR ratio of the magnetic memory device 10 having the interface magnetic layer IPA on a thickness t of the interface magnetic layer IPA.

Referring to FIGS. 12 and 13, although the interface magnetic layer IPA may have an intrinsic in-plane magnetization property, a magnetization direction thereof may be changed to be parallel to a thickness direction (for example, Z direction) of the interface magnetic layer IPA, owing to contact with the perpendicular magnetization inducing layer PM. Such an interface perpendicular magnetic anisotropy may result, for example, from at least one of various possible causes. The interface perpendicular magnetic anisotropy may, for instance, result from chemical bonding between metal and oxygen. In the case where the perpendicular magnetization inducing layer PM contains metal oxide (e.g., MgO) and the interface magnetic layer IPA contains CoFeB, for example, the interface perpendicular magnetic anisotropy may result from a chemical bonding between oxygen (O) in the perpendicular magnetization inducing layer PM and iron (Fe) in the interface magnetic layer IPA. Such a bonding between oxygen and iron may be increased, for example, when nonmetal elements, e.g., boron (B), in the interface magnetic layer IPA are out-diffused or exhausted from an interface between the perpendicular magnetization inducing layer PM and the interface magnetic layer IPA. A thermal treatment process, which may, for example, be performed after a deposition of the interface magnetic layer IPA, may cause out-diffusion of or exhaust the nonmetal elements, e.g., boron (B), and the interface perpendicular magnetic anisotropy may be caused thereby.

The interface perpendicular anisotropy of the interface magnetic layer IPA may vary depending on a thickness thereof. For example, the interface perpendicular anisotropy, $K_u*t$, may be represented by the following equation:

$$Ku \cdot t = \frac{1}{2} \cdot Hk \cdot Ms \cdot t,$$ [Equation 1]

where $H_k$ is a hard axis anisotropy field, $M_s$ is a saturated magnetization, t is a thickness, and $K_u$ is an anisotropy energy.

As shown in FIG. 13, the interface perpendicular anisotropy, $K_u*t$, has a maximum at a specific thickness of the interface magnetic layer IPA, which will be referred to as a "maximum anisotropy thickness" $t_M$. That is, the interface perpendicular anisotropy of the interface magnetic layer IPA increases gradually in the thickness range from a first thickness $t_1$ to the maximum anisotropy thickness $t_M$, and then, decreases gradually in the thickness range from the maximum anisotropy thickness $t_M$ to a second thickness $t_2$. The first thickness $t_1$ may be the minimum thickness of the interface magnetic layer IPA that allows the interface magnetic layer IPA to have the perpendicular magnetization. For example, in the case where the interface magnetic layer IPA has a thickness that is less than the first thickness $t_1$, the interface magnetic layer IPA may exhibit in-plane magnetization or have a non-magnetic property.

The second thickness $t_2$ may be the maximum thickness of the interface magnetic layer IPA that still allows the interface magnetic layer IPA to have the perpendicular magnetization. For example, in the case where the interface magnetic layer IPA has a thickness greater than the second thickness $t_2$, the interface magnetic layer IPA may exhibit in-plane magnetization, which results from a relatively decreased dependency on the perpendicular magnetization inducing layer PM.

In other words, the interface perpendicular anisotropy of the interface magnetic layer IPA may be dependent on the thickness t thereof, and this may affect a magnetoresistance (MR) ratio of the magnetic memory device 10 with the perpendicular magnetization inducing layer PM and the interface magnetic layer IPA. The MR ratio of the magnetic memory device 10 may be represented by the following equation:

MR ratio=$(R_{ap}-R_p)/R_p$, [Equation 2]

where Rap is antiparallel resistance and Rp is parallel resistance.

As can be further seen from FIG. 13, the MR ratio of the magnetic memory device 10 varies according to thickness in a manner similar to the interface perpendicular anisotropy, but a thickness for the maximum MR ratio (hereinafter, referred to as a maximum MR thickness, $t_R$) is greater than the maximum anisotropy thickness $t_M$.

The first thickness $t_1$, the second thickness $t_2$, the maximum anisotropy thickness $t_M$, and the maximum MR ratio thickness $t_R$ may be changed or controlled by changing materials and compositions of the interface magnetic layer IPA and the perpendicular magnetization inducing layer PM. For example, when the interface magnetic layer IPA contains CoFeB and the perpendicular magnetization inducing layer PM contains MgO, the first thickness $t_1$ may be about 6 Å, the second thickness $t_2$ may be about 12 Å, the maximum anisotropy thickness $t_M$ may be about 8-9 Å, and the maximum MR ratio thickness $t_R$ may be about 11 Å.

Referring to FIGS. 4, 12, and 13, the thickness of the first free layer FL1 may be determined based on the desired MR ratio, and the thickness of the second free layer FL2 may be determined based on the desired switching current. For example, the first free layer FL1 may be formed relatively thick to obtain a high MR ratio, and the second free layer FL2 may be formed relatively thin to achieve a low switching current. The switching current may have no dependence or only a weak dependence on the thickness of the first free layer FL1, when compared with the second free layer FL2, while the MR ratio may have no dependence or only a weak dependence on the thickness of the second free layer FL2, when compared with the first free layer FL1.

In example embodiments, the tunnel barrier TBR may serve as the perpendicular magnetization inducing layer PM, and the first and second free layers FL1 and FL2, respectively, may serve as the interface magnetic layer IPA. According to the present embodiment, similar to the tunnel barrier TBR, the perpendicular magnetization enhancement layer 150 may serve as the perpendicular magnetization inducing layer PM inducing or enhancing the perpendicular anisotropy of the second free layer FL2.

Hereinafter, the thicknesses of the first and second free layers FL1 and FL2, respectively, will be discussed in more detail.

The thickness of the second free layer FL2 may be greater than the minimum thickness required for realizing perpendicular magnetization of the second free layer FL2 and may be less than a thickness, i.e., the maximum anisotropy thickness, for allowing the second free layer FL2 to have the maximum perpendicular anisotropy. In other words, in the case where the second free layer FL2 is used as the interface magnetic layer IPA of FIGS. 12 and 13, the thickness of the second free layer FL2 may be greater than the first thickness $t_1$ and less than the maximum anisotropy thickness $t_M$. Since the second free layer FL2 is further away from the tunnel barrier TBR than the first free layer FL1 is, it governs a switching current required for switching magnetization directions of the magnetic tunnel junction. The switching current of the magnetic tunnel junction, at a temperature of 0 K, may be represented by the following equation:

$$Ic = \alpha \frac{2e}{\hbar} \frac{Ms \cdot V}{\eta} H_k,$$ [Equation 3]

where e is the electric charge, $\hbar$ is the Planck constant divided by $2\pi$, $\eta$ is a spin polarization efficiency, $H_k$ is a hard axis anisotropy field, Ms is a saturated magnetization, V is a volume, and $\alpha$ is a proportional factor.

To meet the rising demand for a high-density and high-speed magnetic memory device, it is desirable to reduce the switching current. As can be seen from equation 3, the hard axis anisotropy field $H_k$, the saturated magnetization (Ms), and the volume (V) should be decreased in order to reduce the switching current (Ic). For a perpendicular magnetic device based on the interface perpendicular magnetic anisotropy, reducing the hard axis anisotropy field $H_k$ of the free layer may result in a reduction of the MR ratio. According to principles of the present inventive concepts, however, the free layer may include the first free layer FL1 and the second free layer FL2, and the switching current may be mainly affected by the second free layer FL2, which has a relatively small thickness and is positioned relatively far from the tunnel barrier TBR.

For example, in the case where the magnetization direction of the second free layer FL2 is switched by an electric current applied to the magnetic memory device, the magnetization of the first free layer FL1 may be switched using the first exchange-coupling layer 105 to have an antiparallel magnetization relative to that of the second free layer FL2. Here, the switching current of magnetic memory device may be determined primarily or substantially entirely by the second free layer FL2, rather than by the first free layer FL1. The switching current of the magnetic memory device may have substantially no dependence on the first free layer FL1.

The thickness of the first free layer FL1 may be greater than a thickness, i.e., the maximum anisotropy thickness, for allowing the first free layer FL1 to have the maximum perpendicular anisotropy, and may be less than the maximum thickness at which the first free layer FL1 exhibits the in-plane magnetization. For example, where the first free layer FL1 is used as the interface magnetic layer IPA of FIGS. 12 and 13, the thickness of the first free layer FL1 may be greater than the maximum anisotropy thickness $t_M$ and less than the second thickness $t_2$. This thickness range allows the magnetic memory device to have a high MR ratio. As described above, because the switching current is mainly dependent on the second free layer FL2, it is possible to increase the MR ratio without an increase of the switching current, even when the first free layer FL1 is formed to be thicker than the second free layer FL2. The MR ratio may be determined primarily or substantially entirely by the first free layer FL1 and have substantially no dependence on the second free layer FL2.

In the case where the first and second free layers FL1 and FL2, respectively, are formed of the same material, their thicknesses for realizing the maximum perpendicular anisotropy may be the same, but example embodiments of the inventive concepts are not be limited thereto. For example, thicknesses for achieving the maximum perpendicular anisotropy in the layers may be changed depending on materials and crystal structures of the first and second free layers FL1 and FL2, respectively. For example, where the first and second free layers FL1 and FL2, respectively, are formed of the same material, the first free layer FL1 may have a thickness that is at least about 1.5 times of that of the second free layer FL2.

The first and second free layers FL1 and FL2, respectively, may be provided in a single-layer or multi-layered structure including at least one of cobalt, iron, or any alloys thereof. For example, the first and second free layers FL1 and FL2 may be provided in a single-layer or multi-layered structure including at least one of CoFeB, CoHf, Co, or CoZr. In example embodiments, the first and second free layers FL1 and FL2, respectively, may have a double-layered structure including Co and CoHf layers or a single-layer or multi-layered structure including CoFeB layers. The above enumerated materials provide examples of materials allowing the first and second free layers FL1 and FL2, respectively, to have the intrinsic in-plane magnetization property, but the inventive concepts are not limited thereto.

When the tunnel barrier TBR contains MgO having a NaCl structure, the first free layer FL1 may be formed to have a body centered cubic (BCC) structure that is similar to a lattice structure of the tunnel barrier TBR. The perpendicular magnetization property and the crystal structure of the first free layer FL1 may be achieved by an additional thermal treatment process, which may be performed after deposition of the first free layer FL1. For example, at least a portion of the first free layer FL1 may have an amorphous structure just after its deposition is finished, but as the result of a subsequent thermal treatment process, it may be transformed to have the extrinsic perpendicular magnetization property. In this case, the lattice structure of the first free layer FL1 may be changed by that of the tunnel barrier TBR. For example, in the case where the tunnel barrier TBR has a NaCl structure, the first free layer FL1 may have the BCC structure that is similar to the NaCl structure. For example, a {001} plane of the tunnel barrier TBR and a {001} plane of the first free layer FL1 may be in contact with each other and thereby form an interface. The presence of the interface with the matched lattice structure between the tunnel barrier TBR and the first free layer FL1 may make it possible to improve the MR ratio of the magnetic tunnel junction.

The perpendicular magnetization enhancement layer 150 may include at least a portion having an amorphous structure, and at least a portion of the second free layer FL2 in contact therewith may have the amorphous structure. The perpendicular magnetization enhancement layer 150 may be thinner than the tunnel barrier TBR. For example, the thickness of the tunnel barrier TBR may be at least about 1.5 times of that of the perpendicular magnetization enhancement layer 150. In example embodiments, the perpendicular magnetization enhancement layer 150 may have a thickness ranging from between about 1 Å to about 10 Å, and the tunnel barrier TBR may have a thickness ranging from between about 5 Å to about 15 Å.

The perpendicular magnetization enhancement layer 150 may have a lower resistance than the tunnel barrier TBR. For example, the perpendicular magnetization enhancement layer 150 may be lower than the tunnel barrier TBR in terms of a RA value given by a resistance (R) times a contact area (A) with an adjacent layer. In example embodiments, the RA value of the perpendicular magnetization enhancement layer 150 may range from between about 0.1 $\Omega \cdot \mu m^2$ to about 5 $\Omega \cdot \mu m^2$, and that of the tunnel barrier TBR may range from between about 5 $\Omega \cdot \mu m^2$ to about 30 $\Omega \cdot \mu m^2$. Since the perpendicular magnetization enhancement layer 150 and the second free layer FL2 have amorphous portions and a relatively small thickness, it is therefore possible to reduce the switching current of the magnetic memory device.

For the magnetic tunnel junction MTJ with the free magnetic structure FRL according to example embodiments of the inventive concepts, the first free layer FL1 having a relatively large thickness makes it possible to achieve a high MR ratio, and the second free layer FL2 having a relatively small thickness makes it possible to achieve a low switching current.

Figure 5:
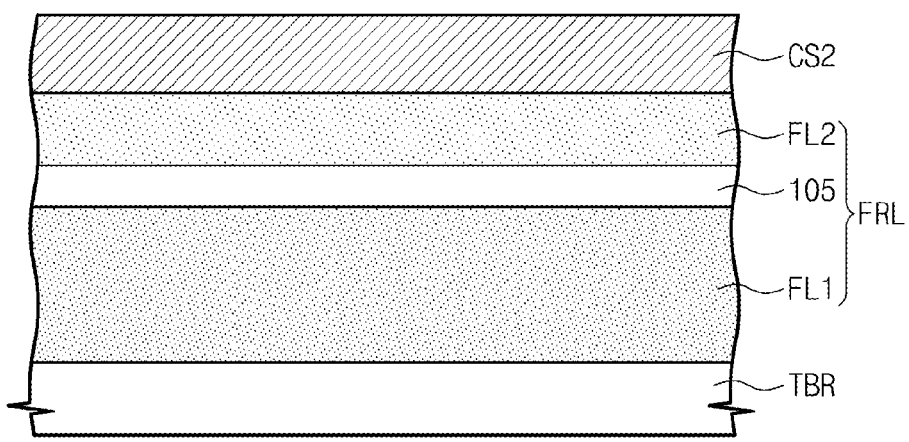
FIG. 5 is a somewhat schematic sectional view illustrating a free magnetic structure of a magnetic tunnel junction according to other example embodiments of the inventive concepts.

FIG. 5 is a somewhat schematic sectional view illustrating a free magnetic structure of a magnetic tunnel junction according to other example embodiments of the inventive concepts. For the sake of brevity, elements and features of this example that are similar to those previously shown and described will not be described in detail.

Referring to FIG. 5, according to other example embodiments of the inventive concepts, the free magnetic structure FRL may include a first free layer FL1, a first exchange-coupling layer 105, and a second free layer FL2, which are sequentially disposed between the tunnel barrier TBR and the second conductive structure CS2. In the present embodiment, the free magnetic structure FRL may be a part of the first type of magnetic tunnel junction MTJ1, as illustrated in FIG. 2. In the present embodiment, the free magnetic structure FRL may be configured without the perpendicular magnetization enhancement layer 150 described with reference to FIG. 4. For example, the second free layer FL2 may be formed to be in contact with the second conductive structure CS2. The first and second free layers FL1 and FL2 may be a single-layer or multi-layered structure including at least one of, for example, CoFeB, CoHf, Co, or CoZr. Both of the first and second free layers FL1 and FL2, respectively, may have the BCC structure.

Figure 6:
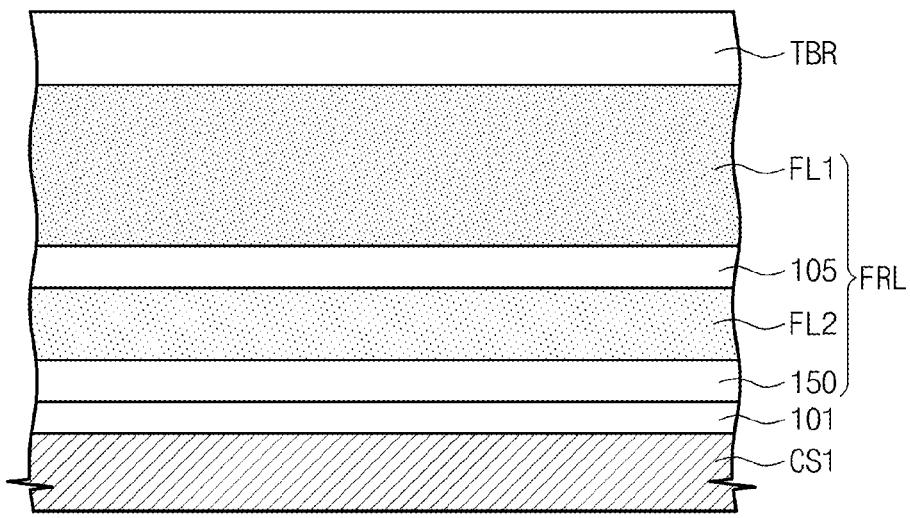
FIGS. 6 and 7 are somewhat schematic sectional views illustrating free magnetic structures of magnetic tunnel junctions according to still other example embodiments of the inventive concepts.
Figure 7:
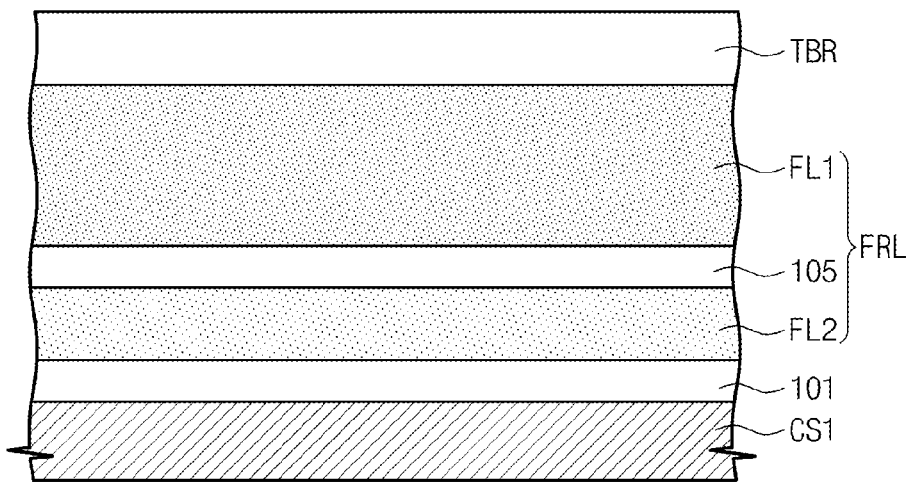

FIGS. 6 and 7 are somewhat schematic sectional views illustrating free magnetic structures of magnetic tunnel junctions according to still other example embodiments of the inventive concepts. For the sake of brevity, elements and features of this example that are similar to those previously shown and described will not be described in detail.

Referring to FIGS. 6 and 7, according to still other example embodiments of the inventive concepts, the free magnetic structure FRL may include a seed layer, the second free layer FL2, the first exchange-coupling layer 105, and the first free layer FL1, which are sequentially disposed between the tunnel bather TBR and the first conductive structure CS1. In the present embodiments, the free magnetic structure FRL may be a part of the second type of magnetic tunnel junction MTJ2 as illustrated in FIG. 3.

The seed layer 101 may include metal atoms constituting a hexagonal close packed (HCP) lattice. For example, the seed layer 101 may include ruthenium (Ru) and/or titanium (Ti). The seed layer 101 may be formed to have a thickness ranging from between about 10 Å to about 100 Å. In other embodiments, the seed layer 101 may include metal atoms constituting a face-centered cubic (FCC) lattice. For example, the seed layer 101 may include at least one of platinum (Pt), palladium (Pd), gold (Au), silver (Ag), copper (Cu), or aluminum (Al). The seed layer 101 may include a single layer or a plurality of layers, at least one of which has a different crystal structure than that of the others.

In the embodiment of FIG. 6, the perpendicular magnetization enhancement layer 150 may be provided between the second free layer FL2 and the seed layer 101. The perpendicular magnetization enhancement layer 150 may contain metal oxide. For example, the perpendicular magnetization enhancement layer 150 may include an oxide of at least one of magnesium (Mg), titanium (Ti), aluminum (Al), magnesium-zinc (MgZn), and magnesium-boron (MgB). For example, the perpendicular magnetization enhancement layer 150 may be formed of magnesium oxide (MgO). At least a portion of the perpendicular magnetization enhancement layer 150 may have an amorphous structure.

In the embodiment of FIG. 7, the free magnetic structure FRL may be configured without the perpendicular magnetization enhancement layer 150 described with reference to FIG. 6. For example, the second free layer FL2 may be in contact with the seed layer 101. In this embodiment, the second free layer FL2 may be formed to be in contact with the second conductive structure CS2. The first and second free layers FL1 and FL2 may be provided in a single-layer or multi-layered structure including at least one of CoFeB, CoHf, Co, or CoZr. Both of the first and second free layers FL1 and FL2, respectively, may have the BCC structure.

Figure 8:
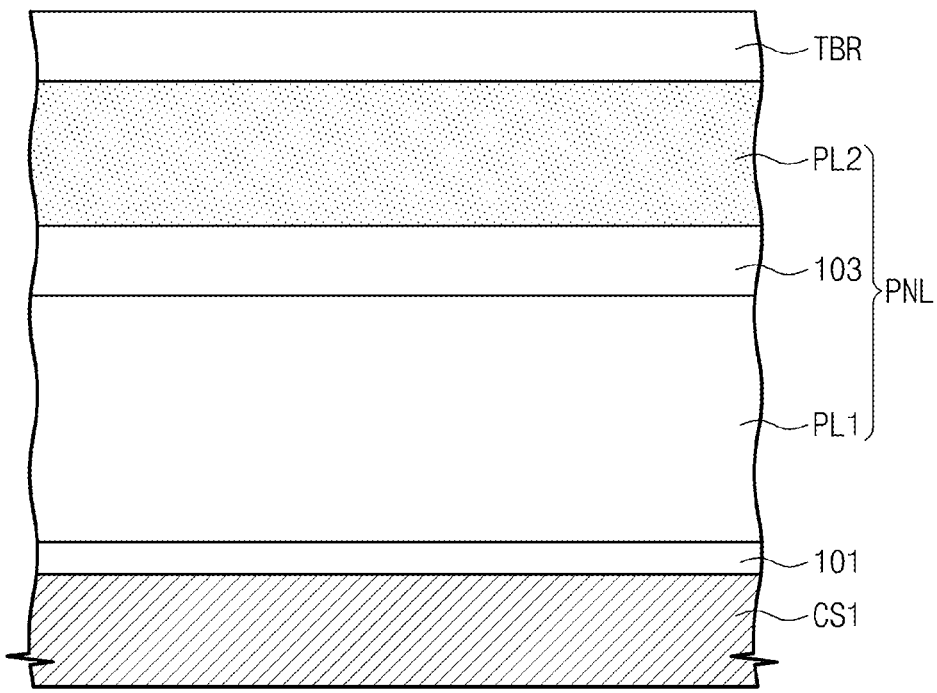
FIG. 8 is a somewhat schematic sectional view illustrating a reference magnetic structure of a magnetic tunnel junction according to example embodiments of the inventive concepts.

FIG. 8 is a somewhat schematic sectional view illustrating a reference magnetic structure of a magnetic tunnel junction according to further example embodiments of the inventive concepts.

Referring to FIG. 8, according to example embodiments of the inventive concepts, the reference magnetic structure PNL may include a first reference layer PL1, a second exchange-coupling layer 103, and a second reference layer PL2, which may be sequentially disposed between the tunnel barrier TBR and the first conductive structure CS1. The seed layer 101 may be provided between the reference magnetic structure PNL and the first conductive structure CS1. The reference magnetic structure PNL of the present embodiment may, for example, be a part of the first type of magnetic tunnel junction MTJ1 illustrated in FIG. 2.

The seed layer 101 may include metal atoms constituting a hexagonal close packed (HCP) lattice. The seed layer 101 may be formed to have a thickness ranging from between about 10 Å to about 100 Å. The seed layer 101 may include ruthenium (Ru) and/or titanium (Ti). In other embodiments, the seed layer 101 may include metal atoms constituting a face-centered cubic (FCC) lattice. For example, the seed layer 101 may include at least one of platinum (Pt), palladium (Pd), gold (Au), silver (Ag), copper (Cu), or aluminum (Al). The seed layer 101 may include a single layer or a plurality of layers, at least one of which may have a different crystal structure than that of the others. If the first reference layer PL1 has an amorphous state, the seed layer 101 may be omitted.

The first reference layer PL1 may have a magnetization direction that is substantially perpendicular to a top surface of the tunnel barrier TBR. The first reference layer PL1 may include at least one of materials having the $L_{10}$ structure, materials having the hexagonal closed packed structure, and amorphous rare-earth transition metal (RE-TM) alloys. In example embodiments, the first reference layer PL1 may include at least one material having an $L_{10}$ structure, such as $Fe_{50}Pt_{50}$, $Fe_{50}Pd_{50}$, $CO_{50}Pt_{50}$, $Co_{50}Pd_{50}$, and $Fe_{50}Ni_{50}$. In other embodiments, the first reference layer PL1 may include at least one of cobalt-platinum (CoPt) disordered alloys, in which platinum (Pt) is contained to have a content of between about 10 to about 45 at. %, or $Co_3Pt$ ordered alloys. In still other embodiments, the first reference layer PL1 may include at least one of the amorphous RE-TM alloys, in which at least one of iron (Fe), cobalt (Co), or nickel (Ni) and at least one of rare-earth metals (such as terbium (Tb), dysprosium (Dy), and gadolinium (Gd)) are contained.

The second exchange-coupling layer 103 may be provided on the first reference layer PL1. The second exchange-coupling layer 103 may be formed to have a thickness of between about 2 Å to about 20 Å. The second exchange-coupling layer 103 may not have a crystallographic texture. For example, the second exchange-coupling layer 103 may be formed on the first reference layer PL1 to have a uniform thickness, but it may not have the crystallographic texture, due to its small thickness. In the present specification, "crystallographic texture" means a crystallographic orientation of a polycrystalline layer. In other words, the second exchange-coupling layer 103 without any crystallographic texture may include grains with random orientation.

A pinning layer may further be provided below the first reference layer PL1. The pinning layer may include at least one antiferromagnetic material. For example, the pinning layer may include at least one of PtMn, IrMn, FeMn, NiMn, MnO, MnS, MnTe, MnF$_2$, FeF$_2$, FeCl$_2$, FeO, CoCl$_2$, CoO, NiCl$_2$, NiO, or Cr. The pinning layer may fix a magnetization direction of a magnetic layer adjacent thereto.

The second exchange-coupling layer 103 may include at least one non-magnetic metal element including one or more non-magnetic transition metals. For example, the second exchange-coupling layer 103 may include at least one of magnesium (Mg), aluminum (Al), titanium (Ti), chromium (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobium (Nb), zirconium (Zr), yttrium (Y), or hafnium (Hf).

In example embodiments, the second exchange-coupling layer 103 may include a plurality of layers. For example, the second exchange-coupling layer 103 may include a lower metal compound layer, a non-magnetic metal layer, and an upper metal compound layer that are sequentially stacked. The non-magnetic metal layer may include at least one of magnesium (Mg), aluminum (Al), titanium (Ti), chromium (Cr), ruthenium (Ru), copper (Cu), zinc (Zn), tantalum (Ta), gold (Au), silver (Ag), palladium (Pd), rhodium (Rh), iridium (Ir), molybdenum (Mo), vanadium (V), tungsten (W), niobium (Nb), zirconium (Zr), yttrium (Y), or hafnium (Hf). The lower and upper metal compound layers may include metal oxides, metal nitrides, metal oxynitrides, or any combination thereof. For example, the metal compound layer may include compounds of the non-magnetic metal layer. The upper and lower metal compound layers may prevent metal atoms in the non-magnetic metal layer from being diffused into other adjacent layers.

The second reference layer PL2 may be provided on the second exchange-coupling layer 103. The second reference layer PL2 may include a soft magnetic material. The second reference layer PL2 may have a low damping constant and a high spin polarization ratio. For example, the second reference layer PL2 may include at least one of cobalt (Co), iron (Fe), or nickel (Ni). The second reference layer PL2 may further include at least one of non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). For example, the second reference layer PL2 may include a layer of CoFe or NiFe, in which boron (B) may be added. Furthermore, to lower the saturated magnetization of the second reference layer PL2, the second reference layer PL2 may further include at least one of titanium (Ti), aluminum (Al), silicon (Si), magnesium (Mg), tantalum (Ta), or silicon (Si).

The second reference layer PL2 may be coupled with the first reference layer PL1 through an antiferromagnetic exchange coupling by the second exchange-coupling layer 103, thereby having a magnetization direction that is parallel to a thickness direction thereof. For example, the second reference layer PL2 may have a magnetization direction that is substantially perpendicular to the top surface of the tunnel bather TBR. In other embodiments, the second exchange-coupling layer 103 may be omitted.

Figure 9:
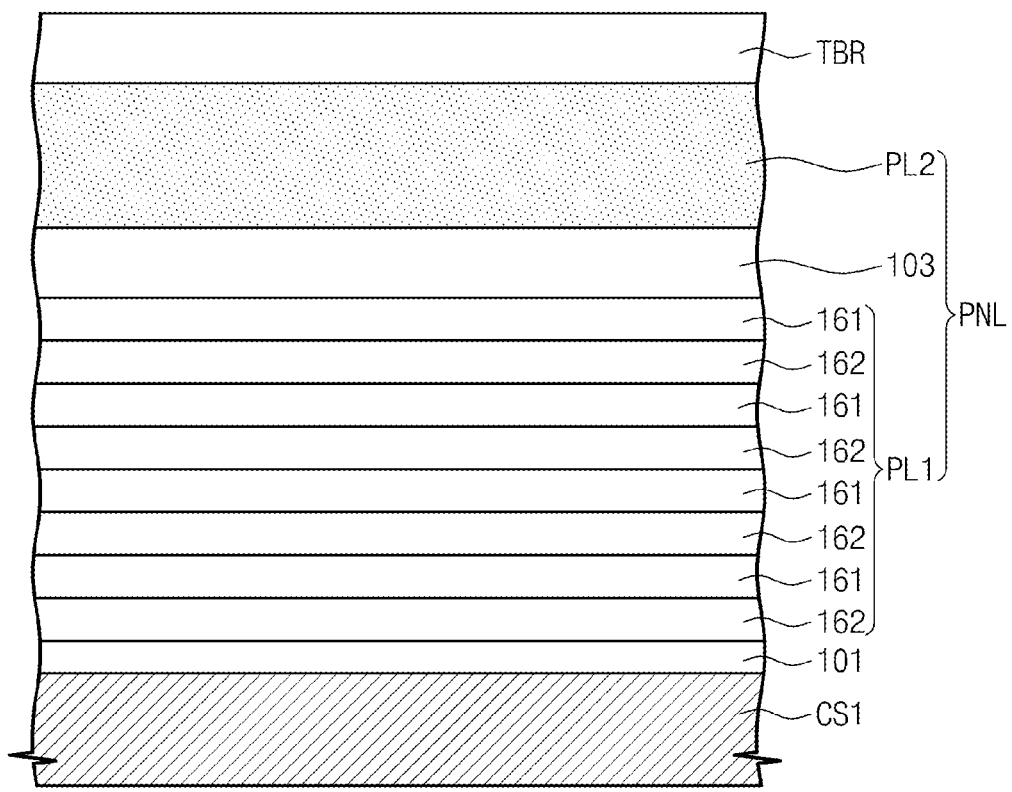
FIG. 9 is a somewhat schematic sectional view illustrating a reference magnetic structure of a magnetic tunnel junction according to other example embodiments of the inventive concepts.

FIG. 9 is a somewhat schematic sectional view illustrating a reference magnetic structure of a magnetic tunnel junction according to other example embodiments of the inventive concepts. For the sake of brevity, elements and features of this example that are similar to those previously shown and described will not be described in detail.

Referring to FIG. 9, the first reference layer PL1 may be provided between the seed layer 101 and the second exchange-coupling layer 103. According to the present embodiment, the reference magnetic structure PNL may be a part of the first type of magnetic tunnel junction MTJ1 illustrated in FIG. 2. The first reference layer PL1 may include non-magnetic layers 161 and ferromagnetic layers 162, which may be alternately stacked on top of each other. The ferromagnetic layers 162 may include at least one of iron (Fe), cobalt (Co), or nickel (Ni), while the non-magnetic layers 161 may include at least one of chromium (Cr), platinum (Pt), palladium (Pd), iridium (Ir), ruthenium (Ru), rhodium (Rh), osmium (Os), rhenium (Re), gold (Au), or copper (Cu). For example, the first reference layer PL1 may include at least one of [Co/Pt]$_n$, [Co/Pd]$_n$, [Ni/Pt]$_n$, or any combination thereof, where n denotes the number of times the layers are stacked and is a natural number greater than or equal to 2. The ferromagnetic layers 162 may be formed to have a small thickness corresponding, for example, to a thickness of between one and several atoms. The first reference layer PL1 may be coupled with the second reference layer PL2 in an antiferromagnetically exchange coupling manner through the second exchange-coupling layer 103. Elements other than those of the first reference layer PL1 may be configured to have substantially the same features as that of the embodiments described with reference to FIG. 8.

Figure 10:
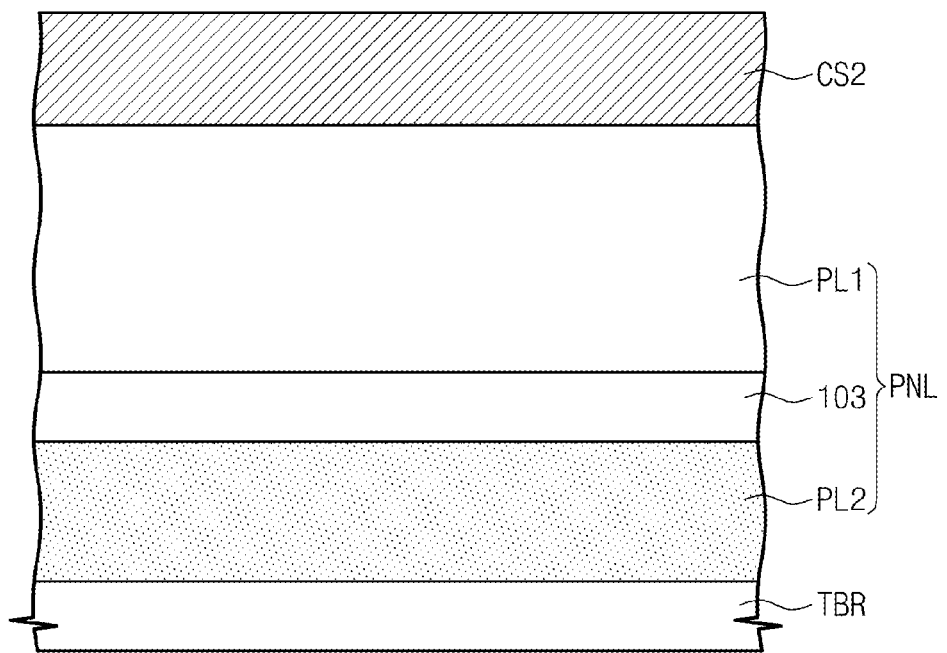
FIGS. 10 and 11 are somewhat schematic sectional views illustrating reference magnetic structures of magnetic tunnel junctions according to still other example embodiments of the inventive concepts.
Figure 11:
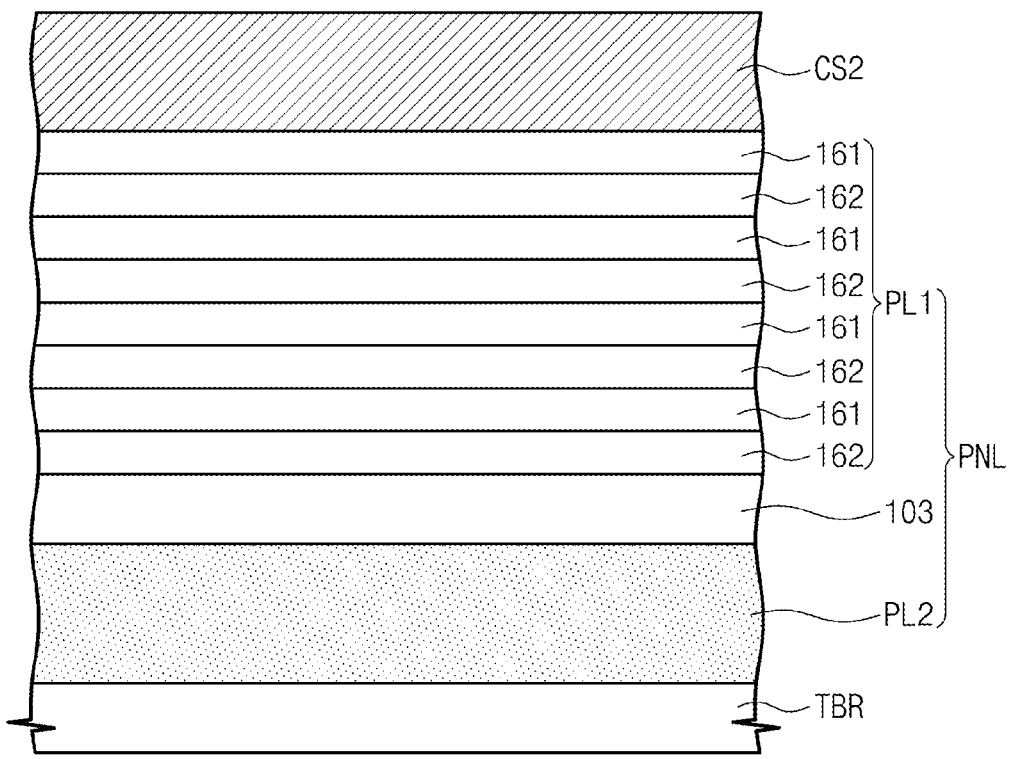

FIGS. 10 and 11 are somewhat schematic sectional views illustrating reference magnetic structures of magnetic tunnel junctions according to still other example embodiments of the inventive concepts. For the sake of brevity, elements and features of this example that are similar to those previously shown and described will not be described in detail.

Referring to FIGS. 10 and 11, according to still other example embodiments of the inventive concepts, the reference magnetic structure PNL may include the second reference layer PL2, the second exchange-coupling layer 103, and the first reference layer PL1, which may be sequentially disposed between the tunnel barrier TBR and the second conductive structure CS2. According to the present embodiment, the reference magnetic structure PNL may be a part of the second type of magnetic tunnel junction MTJ2 illustrated in FIG. 3.

The second reference layer PL2 may include a soft magnetic material. The second reference layer PL2 may have a low damping constant and a high spin polarization ratio. For example, the second reference layer PL2 may include at least one of cobalt (Co), iron (Fe), or nickel (Ni). The second reference layer PL2 may further include at least one of non-magnetic materials (e.g., boron (B), zinc (Zn), aluminum (Al), titanium (Ti), ruthenium (Ru), tantalum (Ta), silicon (Si), silver (Ag), gold (Au), copper (Cu), carbon (C), and nitrogen (N)). For example, the second reference layer PL2 may include a layer of CoFe or NiFe, in which boron (B) may be added. Furthermore, to lower the saturated magnetization of the second reference layer PL2, the second reference layer PL2 may further include at least one of titanium (Ti), aluminum (Al), silicon (Si), magnesium (Mg), tantalum (Ta), or silicon (Si).

In the embodiment of FIG. 10, the first reference layer PL1 may include at least one of materials having the L10 structure, materials having the hexagonal closed packed structure, and amorphous rare-earth transition metal (RE-TM) alloys. In example embodiments, the first reference layer PL1 may include at least one material having the L10 structure, such as Fe$_{50}$Pt$_{50}$, Fe$_{50}$Pd$_{50}$, Co$_{50}$Pt$_{50}$, Co$_{50}$Pd$_{50}$ and Fe$_{50}$Ni$_{50}$. In other embodiments, the first reference layer PL1 may include at least one of cobalt-platinum (CoPt) disordered alloys, in which platinum (Pt) is contained to have a content of between about 10 to about 45 at. %, or Co$_3$Pt ordered alloys having the hexagonal closed packed structure. In still other embodiments, the first reference layer PL1 may include at least one of the amorphous RE-TM alloys, in which at least one of iron (Fe), cobalt (Co), or nickel (Ni) and at least one of rare-earth metals (such as terbium (Tb), dysprosium (Dy), and gadolinium (Gd)) are contained.

In the embodiment of FIG. 11, the first reference layer PL1 may include non-magnetic layers 161 and ferromagnetic layers 162, which may be alternatingly stacked on top of each other. The ferromagnetic layers 162 may include at least one of iron (Fe), cobalt (Co), or nickel (Ni), while the non-magnetic layers 161 may include at least one of chromium (Cr), platinum (Pt), palladium (Pd), iridium (Ir), ruthenium (Ru), rhodium (Rh), osmium (Os), rhenium (Re), gold (Au), or copper (Cu). For example, the first reference layer PL1 may include at least one of [Co/Pt]$_n$, [Co/Pd]$_n$, [Ni/Pt]$_n$, or any combination thereof, where n denotes the number of times the layers are stacked and is a natural number equal to or greater than 2. The ferromagnetic layers 162 may be formed to have a small thickness corresponding, for example, to a thickness of between one to several atoms. The first reference layer PL1 may be coupled with the second reference layer PL2 in an antiferromagnetically exchange coupling manner through the second exchange-coupling layer 103.

Figure 14:
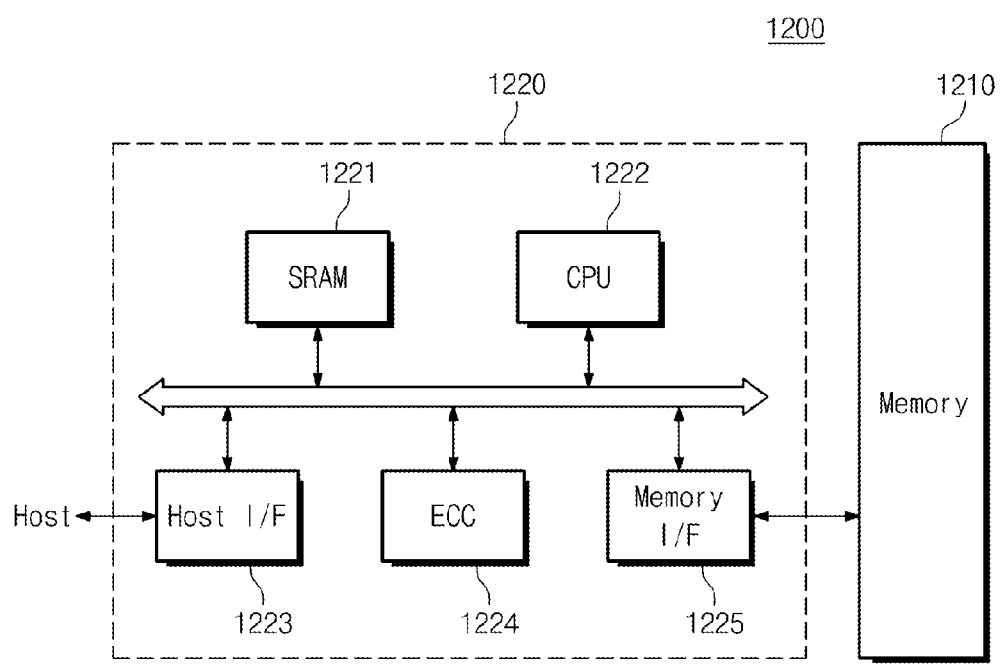
FIGS. 14 and 15 are block diagrams schematically illustrating electronic devices including one or more semiconductor devices constructed according to example embodiments of the inventive concepts.
Figure 15:
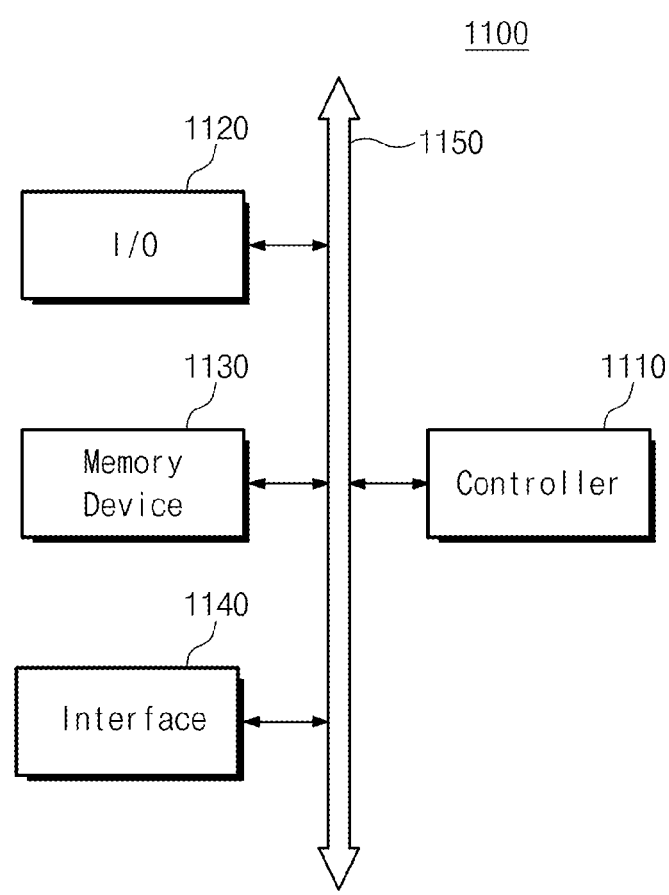

FIGS. 14 and 15 are block diagrams schematically illustrating electronic devices including a semiconductor device according to example embodiments of the inventive concepts.

Referring to FIG. 15, an electronic device 1100 that includes one or more semiconductor devices constructed according to example embodiments of the inventive concepts may be implemented in a personal digital assistant (PDA), a laptop computer, a mobile computer, a web tablet, a wireless phone, a cell phone, a digital music player, a wired or wireless electronic device, or a complex electronic device including at least two of the foregoing devices. The electronic device 1100 may include a controller 1110, an input/output device 1120 such as a keypad, a keyboard, a display, a memory device 1130, and a wireless interface 1140 that are connected to each other through a bus 1150. The controller 1110 may include, for example, at least one microprocessor, a digital signal processor, a microcontroller, or the like. The memory device 1130 may be configured to store a command code to be used by the controller 1110 or user data. The memory 1130 may include one or more semiconductor devices constructed according to example embodiments of the inventive concepts. The electronic device 1100 may use a wireless interface 1140 configured to transmit data to or receive data from a wireless communication network using a RF signal. The wireless interface 1140 may include, for example, an antenna, a wireless transceiver, and so on. The electronic system 1100 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 14, a memory system including one or more semiconductor devices constructed according to example embodiments of the inventive concepts will now be described. The memory system 1200 may include a memory 1210 for storing huge amounts of data and a memory controller 1220. The memory controller 1220 controls the memory 1210 so as to read data stored in the memory 1210 or to write data into the memory 1210 in response to a read/write request of a host. The memory controller 1220 may include an address mapping table for mapping an address provided from the host (e.g., a mobile device or a computer system) into a physical address of the memory 1210. The memory 1210 may be a semiconductor device constructed according to example embodiments of the inventive concepts.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline integrated circuit (SOIC) technique, a small outline package (SOP) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, and a wafer-level processed stack package (WSP) technique.

The package in which a semiconductor memory device constructed according to one of the above embodiments is mounted may further include at least one semiconductor device (e.g., a controller and/or a logic device) that controls the semiconductor memory device.

According to example embodiments of the inventive concepts, a magnetic tunnel junction may include two free layers having two different thicknesses, thereby providing a magnetic memory device that has an increased MR ratio and a reduced switching current. In example embodiments, a perpendicular magnetization property of a second free layer can be improved by a perpendicular magnetization enhancement layer.

While example embodiments of the inventive concepts have been particularly shown and described, it will be understood by one of ordinary skill in the art that variations in form and detail may be made therein without departing from the spirit and scope of the attached claims.

What is claimed is:

1. A magnetic memory device, comprising:
   a tunnel barrier on a substrate;
   a free magnetic structure; and
   a reference magnetic structure spaced apart from the free magnetic structure and arranged on an opposite side of the tunnel barrier,
   wherein the free magnetic structure comprises:
      a first free layer and a second free layer spaced apart from each other on opposite sides of an exchange-coupling layer, the first and second free layers having an interface perpendicular magnetic anisotropy, the second free layer including at least one portion having an amorphous structure; and
      a perpendicular magnetization enhancement layer being in contact with the second free layer and being spaced apart from the exchange-coupling layer on an opposite side of the second free layer, the perpendicular magnetization enhancement layer including a metal oxide layer and the metal oxide layer including at least one portion having an amorphous structure, wherein the second free layer is thinner than the first free layer, and wherein the perpendicular magnetization enhancement layer is thinner than the tunnel junction.

2. A magnetic memory device, comprising:

a tunnel barrier on a substrate; and a free magnetic structure and a reference magnetic structure separated from each other by the tunnel barrier, wherein the free magnetic structure comprises:

a first free layer and a second free layer separated from each other by an exchange-coupling layer, the second free layer including at least one portion having an amorphous structure; and a perpendicular magnetization enhancement layer being in contact with the second free layer and being separated from the exchange-coupling layer by the second free layer, the perpendicular magnetization enhancement layer including a metal oxide layer and the metal oxide layer including at least one portion having an amorphous structure, wherein a thickness of the perpendicular magnetization enhancement layer is less than a thickness of the tunnel barrier.

3. A magnetic memory device, comprising:

a free magnetic structure, and a reference magnetic structure spaced apart from the free magnetic structure and having a tunnel barrier arranged therebetween, wherein the free magnetic structure comprises:

an exchange-coupling layer, a first free layer between the tunnel barrier and the exchange-coupling layer, a second free layer spaced apart from the first free layer with the exchange-coupling layer interposed therebetween, the second free layer including at least one portion having an amorphous structure, and a perpendicular magnetization enhancement layer spaced apart from the exchange-coupling layer with the second free layer interposed therebetween, the perpendicular magnetization enhancement layer including a metal oxide layer and the metal oxide layer including at least one portion having an amorphous structure, wherein a thickness of the first free layer is greater than a first maximum anisotropy thickness at which the first free layer has a maximum perpendicular anisotropy, wherein a thickness of the second free layer is less than a second maximum anisotropy thickness at which the second free layer has a maximum perpendicular anisotropy, and wherein a thickness of the perpendicular magnetization enhancement layer is less than a thickness of the tunnel barrier.

4. The magnetic memory device of claim 3, wherein the first free layer comprises the same material as the second free layer, and wherein the thickness of the first free layer is at least about 1.5 times of that of the second free layer.

5. The magnetic memory device of claim 3, wherein the perpendicular magnetization enhancement layer is in contact with the second free layer.

6. The magnetic memory device of claim 3, wherein an RA value of the perpendicular magnetization enhancement layer is less than that of the tunnel barrier.

7. The magnetic memory device of claim 3, further comprising a substrate, wherein the free magnetic structure is provided between the substrate and the tunnel barrier.

8. The magnetic memory device of claim 3, further comprising a substrate, wherein the free magnetic structure is provided spaced apart from the substrate on an opposite side of the tunnel barrier.

9. The magnetic memory device of claim 3, wherein the perpendicular magnetization enhancement layer includes a plurality of portions having a low angle grain boundary.

10. The magnetic memory device of claim 3, wherein each of the first and second free layers comprises a material exhibiting an intrinsic in-plane magnetization property.

11. The magnetic memory device of claim 10, wherein the first and second free layers each comprise boron and at least one of cobalt, iron, or nickel.

12. The magnetic memory device of claim 3, wherein the exchange-coupling layer comprises metal.

13. The magnetic memory device of claim 12, wherein the exchange-coupling layer comprises at least one of Ta, W, Nb, Ru, Ti, Cr, V, Mo, or Re.

14. The magnetic memory device of claim 3, wherein the first and second free layers are configured to have an interface perpendicular anisotropy.

15. The magnetic memory device of claim 14, wherein the thickness of the first free layer is smaller than a maximum thickness at which the first free layer no longer has perpendicular magnetization, thereby allowing the first free layer to have perpendicular magnetization.

16. The magnetic memory device of claim 14, wherein the thickness of the second free layer is greater than a minimum thickness below which the second free layer does not have perpendicular magnetization, thereby allowing the second free layer to have perpendicular magnetization.

* * * * *